United States Patent
Jun

(10) Patent No.: US 7,785,916 B2
(45) Date of Patent: Aug. 31, 2010

(54) IMAGE SENSOR AND METHOD FOR MANUFACTURING THE SAME

(75) Inventor: Sung-Ho Jun, Songpa-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/344,507

(22) Filed: Dec. 27, 2008

(65) Prior Publication Data

US 2009/0166778 A1   Jul. 2, 2009

(30) Foreign Application Priority Data

Dec. 27, 2007   (JP) .................. 10-2007-0139396

(51) Int. Cl.
*H01L 21/00* (2006.01)
(52) U.S. Cl. ............ 438/69; 438/98; 438/631; 257/E21.575
(58) Field of Classification Search .......... 438/69, 438/73, 75, 98, 622, 631; 257/E21.001, E21.575
See application file for complete search history.

(56) References Cited

U.S. PATENT DOCUMENTS

| | | | |
|---|---|---|---|
| 6,576,940 B2 * | 6/2003 | Maeda | 257/292 |
| 7,364,933 B2 * | 4/2008 | Kim | 438/65 |
| 7,436,012 B2 * | 10/2008 | Mori et al. | 257/292 |
| 2006/0138578 A1 * | 6/2006 | Lim | 257/432 |
| 2009/0065825 A1 * | 3/2009 | Hwang | 257/292 |

* cited by examiner

*Primary Examiner*—Tuan N. Quach
(74) *Attorney, Agent, or Firm*—Sherr & Vaughn, PLLC

(57) ABSTRACT

Embodiments relate to an image sensor and a method for manufacturing the same. According to embodiments, a semiconductor substrate may include a pixel part and a peripheral part. A photo diode pattern may be formed over the pixel part having a height that is greater than a height of a surface of an interlayer dielectric film over the peripheral part. A device isolation film and a metal layer may be provided over the photodiode and over interlayer dielectric film over the peripheral part. A planarization layer may be provided and may compensate for a height difference so that a first metal film pattern connected to the photo diode pattern and a second metal film pattern connected to the metal wire in peripheral part may be simultaneously formed by patterning the planarization layer and metal film.

17 Claims, 8 Drawing Sheets

IMAGE SENSOR AND METHOD FOR MANUFACTURING THE SAME

The present application claims priority under 35 U.S.C. 119 to Korean Patent Application No. 10-2007-0139396 (filed on Dec. 27, 2007), which is hereby incorporated by reference in its entirety.

BACKGROUND

An image sensor may be a semiconductor device that converts an optical image into an electrical signal. Image sensors may be classified into categories, such as a charge coupled device (CCD) image sensor and a complementary metal oxide silicon (CMOS) image sensor (CIS).

A CIS may include a photo diode and a MOS transistor formed in a unit pixel. A CIS may obtain an image by sequentially detecting electrical signals of unit pixels in a switching manner. In a CIS structure, a photo diode region may convert a light signal to an electrical signal, and a transistor may process the electrical signal. A CMOS image sensor may include a photodiode and a MOS transistor within a unit pixel to sequentially detect electrical signals of each unit pixel, implementing an image. A photo diode region and a transistor may be horizontally arranged in a semiconductor substrate.

In a horizontal type CIS according to the related art, a photo diode and a transistor may be horizontally formed adjacent to each other on and/or over a substrate. Therefore, an additional region for forming a photo diode may be required.

SUMMARY

Embodiments relate to a semiconductor device and a method for manufacturing the same. Embodiments relate to an image sensor and a method for manufacturing the same.

Embodiments relate to an image sensor and a method for manufacturing the same which may vertically integrate a transistor circuitry and a photo diode. Embodiments relate to an image sensor and a method for manufacturing the same which may improve both resolution and sensitivity.

Embodiments relate to an image sensor and a method for manufacturing an image sensor which may prevent generation of defects in a photo diode, while implementing a vertical photo diode structure.

According to embodiments, a method for manufacturing an image sensor may include at least one of the following. Forming a semiconductor substrate including a pixel part and a peripheral part. Forming an interlayer dielectric film including a metal wire on and/or over the semiconductor substrate. Forming photo diode patterns reciprocally isolated by a device isolation trench on and/or over the interlayer dielectric film to be connected to the metal wire in the pixel part. Forming a device isolation dielectric layer on and/or over the device isolation trench and photo diode patterns in the pixel part and on and/or over the interlayer dielectric film in the peripheral part, the device isolation dielectric layer having via holes which may partially expose the photo diode patterns and expose the metal wire in the peripheral part. Forming a metal film on and/or over the device isolation dielectric layer with gap-filling the via holes. Forming a planarization layer which may planarize the pixel part and the peripheral part on and/or over the metal film. Forming simultaneously a first metal film pattern connected to the photo diode patterns and a second metal film pattern connected to the metal wire in the peripheral part by patterning the planarization layer and metal film.

According to embodiments, an image sensor may include at least one of the following. An interlayer dielectric film including a metal wire on and/or over a semiconductor substrate including a pixel part and a peripheral part. Photo diode patterns reciprocally isolated by a device isolation trench on and/or over the interlayer dielectric film so as to be connected to the metal wire in the pixel part. A device isolation dielectric layer on and/or over the device isolation trench and photo diode patterns in the pixel part and on and/or over the interlayer dielectric film in the peripheral part, the device isolation dielectric layer having via holes which may partially expose the photo diode patterns and expose the metal wire in the peripheral part. A first metal film pattern gap-filled in the via hole in the pixel part to be connected to the photo diode pattern. A second metal film pattern gap-filled in the via hole in the peripheral part to be connected to the metal wire.

BRIEF DESCRIPTION OF THE DRAWINGS

Example

DESCRIPTION OF THE PREFERRED EMBODIMENTS

Example FIGS. 1 to 9 are cross-sectional views illustrating an image sensor and a method for manufacturing an image sensor, according to embodiments. Referring to example FIG. 1, bottom metal wires 30 and 40 and interlayer dielectric film 20 may be formed on and/or over semiconductor substrate 10.

Semiconductor substrate 10 may be a single crystal or poly crystal silicon substrate, and may be a substrate doped with a p type impurity or an n type impurity. According to embodiments, a device isolation film, which may define an active area and a field area, may be formed in semiconductor substrate 10. According to embodiments, circuitries of pixel part A and peripheral part B may be formed on and/or over an active area.

According to embodiments, a transistor circuitry may be formed on and/or over pixel part A, and may include a reset transistor, a drive transistor, a select transistor, and a transfer transistor. These transistors may convert received photo-charges into electrical signals, and may be connected to a photo diode. Transistors may be formed for each pixel unit.

Interlayer dielectric film 20 may include bottom metal wires 30 and 40, and may be formed on and/or over a top of pixel part A and peripheral part B of semiconductor substrate 10. Bottom metal wires 30 and 40 may connect power lines or signal lines to the circuitries. According to embodiments, interlayer dielectric film 20 may be formed as multi layers.

Bottom metal wires 30 and 40 may include metal wires M and plugs. Bottom metal wires 30 that may be formed on and/or over pixel part A may be formed for each pixel unit. This may enable a transfer of photocharges of a photo diode to circuitry.

Bottom metal wires 30 and 40 may include various conductive materials including at least one of metal, alloys, and silicide. According to embodiments, bottom metal wires 30 and 40 may include aluminum, copper, cobalt or tungsten. According to embodiments, plugs of bottom metal wires 30 and 40 may be exposed at a surface of interlayer dielectric film 20. According to embodiments, when forming bottom metal wires 30 and 40, a pad may be formed on and/or over peripheral part B.

Figure 1:
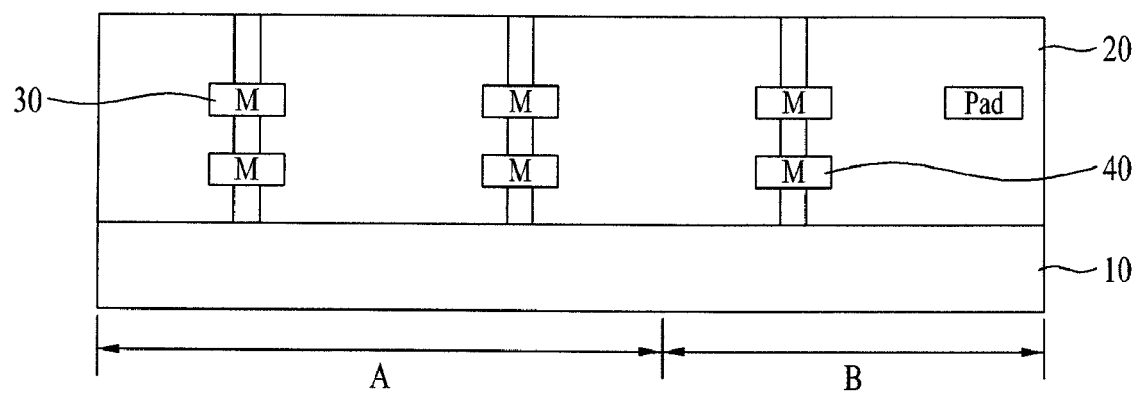
FIGS. 1 through 9 are cross-sectional views illustrating an image sensor and a method for manufacturing an image sensor, according to embodiments.
Figure 2:
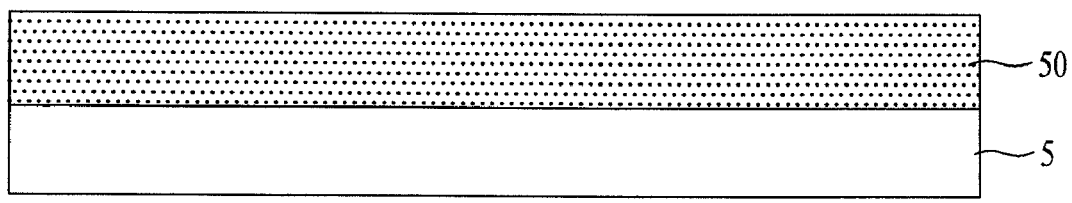

Referring to example FIG. 2, crystalline semiconductor substrate 5 may be provided. Crystalline semiconductor substrate 5 may be a single crystal or poly crystal silicon substrate, and may be a substrate doped with a p type impurity or an n type impurity. According to embodiments, crystalline semiconductor substrate 5 may be a p type substrate. According to embodiments, crystalline semiconductor substrate 5 may be formed having substantially a same size as semiconductor substrate 10. According to embodiments, an epi-layer may be formed in crystalline semiconductor substrate 5.

According to embodiments, photo diode 50 may be formed inside crystalline semiconductor substrate 5. Photo diode 50 may include an n type impurity area and a p type impurity area. Photo diode 50 may be formed to have a PN junction where an n type impurity and a p type impurity may be joined together.

Figure 3:
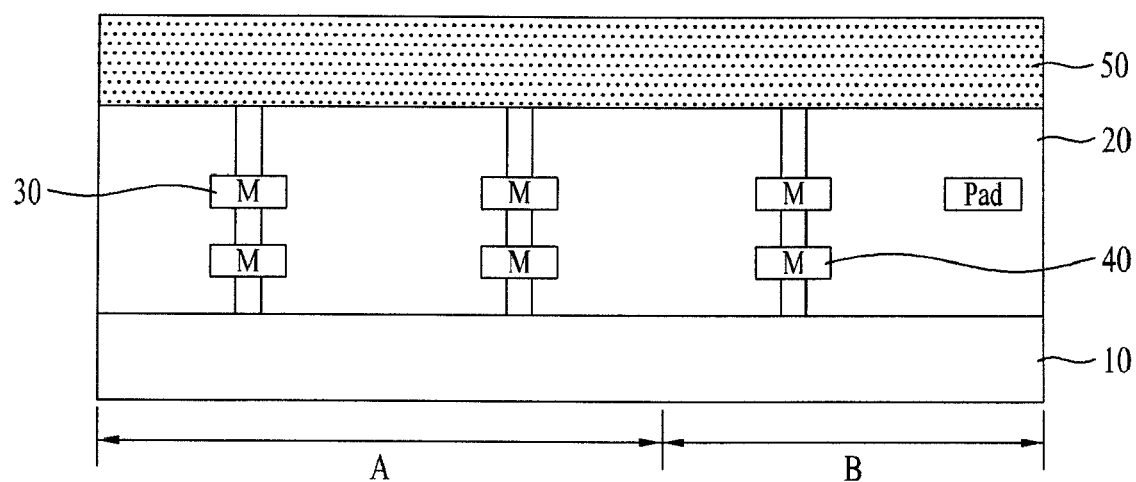

Referring to example FIG. 3, photo diode 50 may be formed on and/or over interlayer dielectric film 20 of semiconductor substrate 10. Semiconductor substrate 10 may be coupled to crystalline semiconductor substrate 5 including photo diode 50. According to embodiments, semiconductor substrate 10 may be coupled to crystalline semiconductor substrate 5 through a bonding process.

According to embodiments, a surface of photo diode 50 of crystalline semiconductor substrate 5 may be positioned on and/or over interlayer dielectric film 20, which may be on and/or over a surface of semiconductor substrate 10. A bonding process may then join them to each other. If semiconductor substrate 10 is coupled to crystalline semiconductor substrate 5, plugs of bottom metal wires 30 and 40 may be electrically connected to photo diode 50 of crystalline semiconductor substrate 5.

According to embodiments, crystalline semiconductor substrate 5 may be removed. Photo diode 50 may remain on and/or over semiconductor substrate 10. According to embodiments, if crystalline semiconductor substrate 5 is removed, only photo diode 50 may remain on and/or over semiconductor substrate 10. According to embodiments, crystalline semiconductor substrate 5 may be removed by an etching process or a chemical mechanical polishing (CMP) process.

According to embodiments, photo diode 50 may remain on and/or over semiconductor substrate 10, and semiconductor substrate 10 and photo diode 50 may form a vertical integration.

Figure 4:
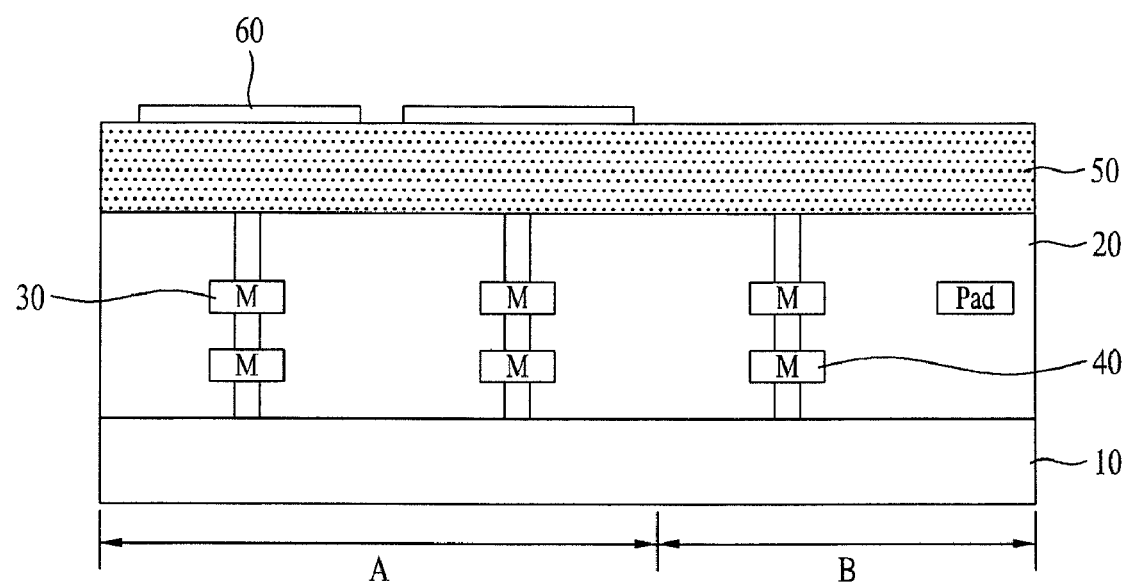

Referring to example FIG. 4, hard mask 60 may be formed on and/or over photo diode 50. Hard mask 60 may be used to classify photo diode 50 for each pixel unit. According to embodiments, hard mask 60 may include an oxide film including tetra ethyl ortho silicate (TEOS).

Hard mask 60 may be formed by forming a hard mask layer on and/or over photo diode 50. A patterning process may then be performed with a photoresist pattern. Hard mask 60 may be formed on and/or over photo diode 50 and may correspond to locations of bottom metal wire 30 in pixel part A. According to embodiments, hard mask 60 may be formed to have a wider area than an area of bottom metal wire 30.

Figure 5:
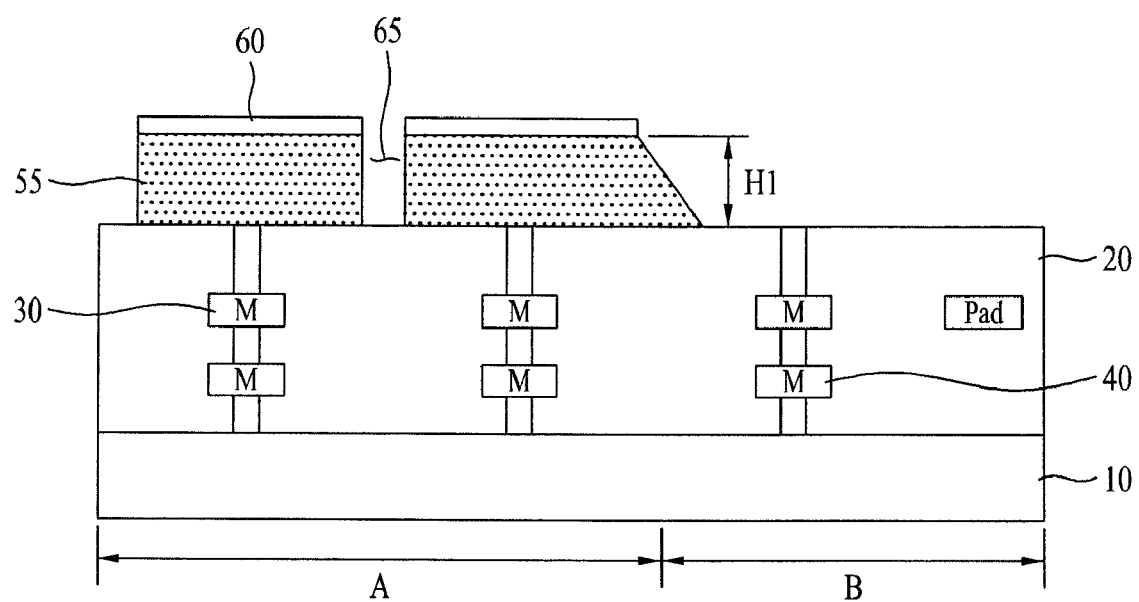

Referring to example FIG. 5, photo diode pattern 55 may be formed on and/or over interlayer dielectric film 20 corresponding to pixel part A. Photo diode pattern 55 may be formed by etching photo diode 50 using hard mask 60 as an etching mask. According to embodiments, photo diode 50 may be selectively removed and may form device isolation trench 65, which may expose interlayer dielectric film 20. According to embodiments, device isolation trench 65 may isolate photo diode 50 for each unit pixel and may thus be formed to have a relatively narrow width. According to embodiments, photo diode pattern 55 may be formed to maximize a width.

According to embodiments, photo diode pattern 55 may be connected to bottom metal wire 30 and may be defined by device isolation trench 65. According to embodiments, photo diode 50 in peripheral part B may be removed. A surface of interlayer dielectric film 20 in peripheral part B may thus be exposed. According to embodiments, if interlayer dielectric film 20 in peripheral part B is exposed, metal wire 40 in peripheral part B may be exposed. According to embodiments, hard mask 60 remaining on and/or over photo diode pattern 55 may not be removed. According to embodiments, hard mask 60 may alternatively be removed.

Photo diode pattern 55 may be formed on and/or over interlayer dielectric film 20 in pixel part A. According to embodiments, photo diode pattern 55 may have first height H1, which may be higher than a height of interlayer dielectric film 20 in peripheral part B. According to embodiments, a step may occur in interlayer dielectric film 20 by a height of photo diode pattern 55. According to embodiments, a step between photo diode pattern 55 and interlayer dielectric film 20 in peripheral part B may be approximately 1.2 to 2.0 μm.

Figure 6:
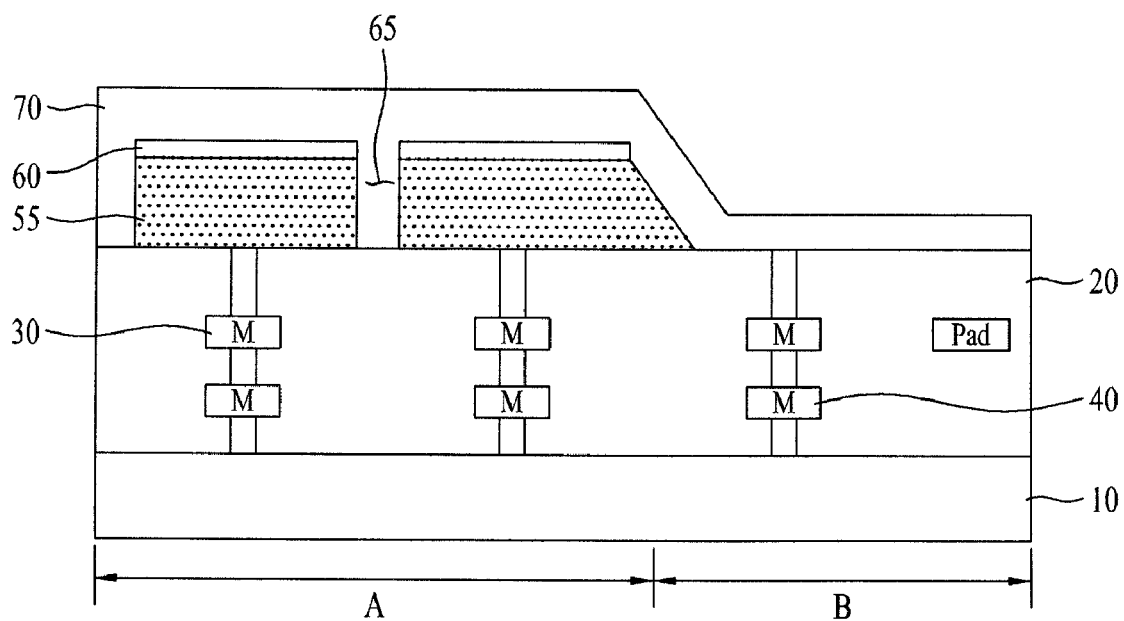

Referring to example FIG. 6, device isolation dielectric layer 70 may be formed on and/or over interlayer dielectric film 20 including photo diode pattern 55 and device isolation trench 65. Device isolation dielectric layer 70 may be formed on and/or over interlayer dielectric film 20 and may cover all photo diode pattern 55 and device isolation trench 65.

Device isolation dielectric layer 70 may be formed to fill device isolation trench 65. According to embodiments, photo diode pattern 55 may be isolated by device isolation dielectric layer 70 for each unit pixel. According to embodiments, device isolation dielectric layer 70 may include an oxide film. According to embodiments, an oxide film may have a thickness of approximately 3000 Å.

Device isolation dielectric layer 70 may be uniformly deposited on and/or over photo diode pattern 55 and interlayer dielectric film 20. According to embodiments, device isolation dielectric layer 70 may have a step corresponding to heights of photo diode pattern 55 and interlayer dielectric film 20 in peripheral part B.

To apply electrical signals to photo diode pattern 55, device isolation dielectric layer 70 may be selectively removed. According to embodiments, to transfer electrical signals to bottom metal wire 40 in peripheral part B, device isolation dielectric layer 70 may also be selectively removed. To expose photo diode pattern 55 and bottom metal wire 40, device isolation dielectric layer 70 may be selectively removed, for example using a photolithography process.

Figure 7:
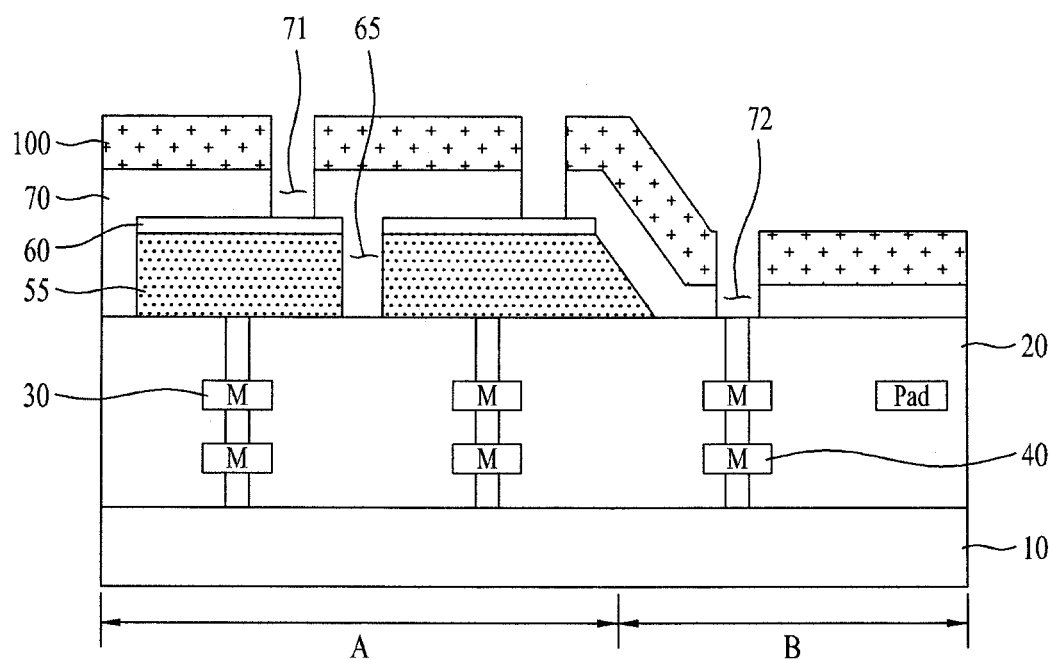

Referring to example FIG. 7, first via hole 71, which may expose photo diode pattern 55 and second via hole 72, which may exposing bottom metal wire 40 in peripheral part B may be formed by selectively etching device isolation dielectric layer 70. According to embodiments, to expose photo diode pattern 55 and bottom metal wire 40, first via hole 71 and second via hole 72 may be formed by forming first photoresist pattern 100 on and/or over device isolation dielectric layer 70. According to embodiments, an etching process may then be performed. According to embodiments, photoresist pattern 100 may be removed through an ashing process.

Figure 8:
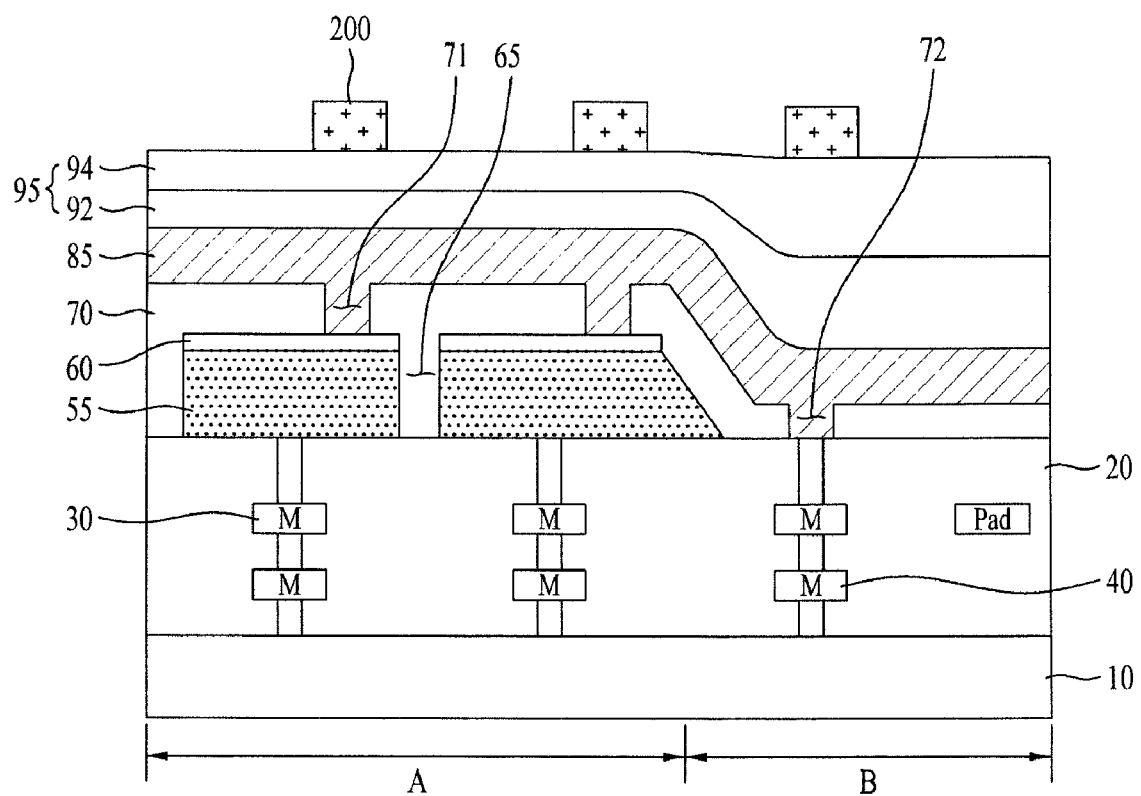

Referring to example FIG. 8, metal film 85 and planarization layer 95 may be formed on and/or over device isolation dielectric layer 70 in which first via hole 71 and second via hole 72 may be formed. According to embodiments, planarization layer 95 may be formed by stacking first polymer 92 and second polymer 94. According to embodiments, metal film 85 may be formed at a thickness of approximately 1000 Å. According to embodiments, second photoresist pattern 200 may be formed on and/or over second polymer 94.

According to embodiments, first polymer 92 may include spin on hard mask (SOH) material containing a carbon (C) group, and may be formed at a thickness of approximately 0.8 μm. According to embodiments, second polymer 94 may include SOH material containing a silicon (Si) group, and may be formed at a thickness of approximately 0.7 μm.

According to embodiments, a thickness of first polymer 92 and second polymer 94 is not limited to the numerical values described above, and may be formed at a thickness of approximately 90 to 110% of a step between pixel part A and peripheral part B. According to embodiments, a ratio of a thickness of first polymer 92 and second polymer 94 may be approximately 3:5 to 4:6. According to embodiments, a ratio of a thickness of first polymer 92 and second polymer 94 may be approximately 4:5.

First polymer 92 and second polymer 94 may be formed through a spin coating process, such that a step between pixel part A and peripheral part B substantially disappears.

If a step occurs in device isolation dielectric layer 70 due to photo diode pattern 55, a photolithography process to form a top metal wire may not be exactly performed. During an exposure process of the lithography, a portion of a photoresist film may be in-focus as a target to be exposed, but other areas may be out of focus due to a step, and may not be exposed. Alternatively, a portion of a photoresist film may be in focus to be opened exactly, but other areas may be out of an exact target point. In other words, since photo diode pattern 55 and interlayer dielectric film 20 of peripheral part B may have a step, it may be difficult in a photo process to pattern metal film 85.

According to embodiments, during a process of patterning metal film 85, a step between pixel part A and peripheral part B may be reduced using planarization layer 95. According to embodiments, metal film 85 may be patterned using second photoresist pattern 200.

Figure 9:
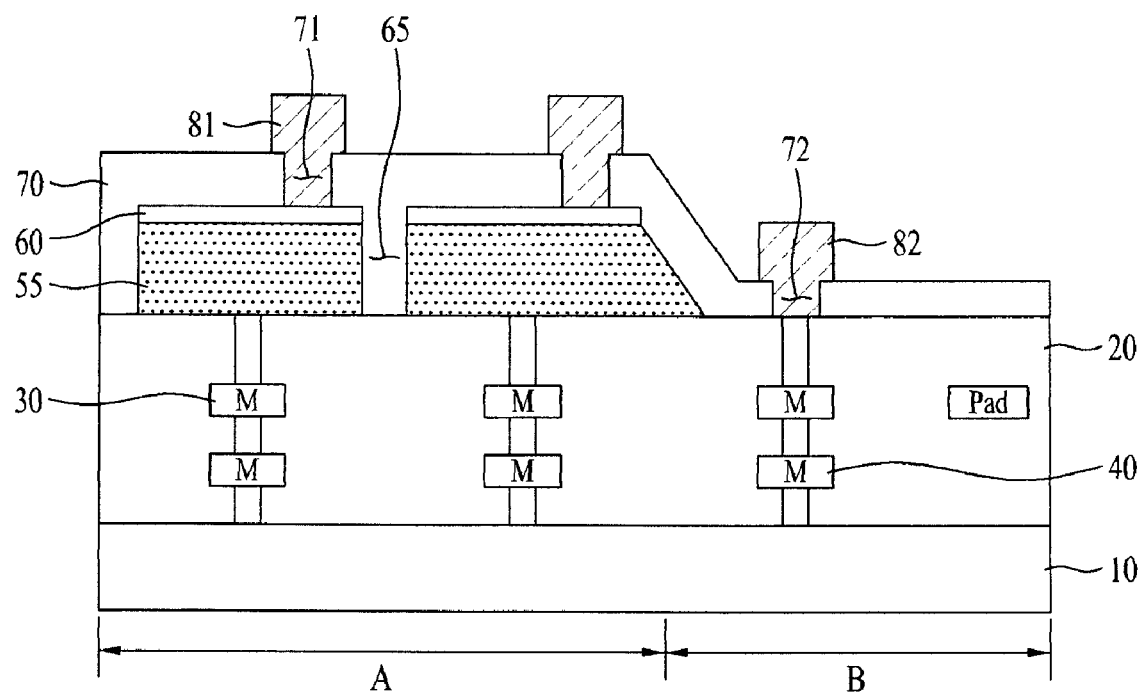

Referring to example FIG. 9, first top metal wire 81 and second top metal wire 82 may be formed by performing an etching process using second photoresist pattern 200 as a mask. According to embodiments, an etching process may include several etching processes. These may include a first etching process where second polymer 94 may be etched, a second etching process where first polymer 92 may be etched, and a third etching process where metal film 85 may be etched. According to embodiments, through a first etching process, a second polymer pattern may be formed on and/or over first polymer 92, and second photoresist pattern 200 may be removed completely.

Although second photoresist pattern 200 may be removed completely through a first etching process, a second etching process where first polymer 92 may be etched using a second polymer pattern as a mask may be performed.

According to embodiments, although the second polymer pattern may be removed completely through a second etching process, a third etching process where metal film 85 may be etched using a first polymer pattern as a mask may be performed.

According to embodiments, through a third etching process, first top metal wire 81 connected to photo diode pattern 55 and second top metal wire 82 connected to bottom metal wire 40 in peripheral part B may be formed simultaneously. According to embodiments, first and second top metal wires 81 and 82 may apply electrical signals to photo diode pattern 55 and bottom metal wire 40. According to embodiments, a color filter and a micro lens may be formed on and/or over device isolation dielectric layer 70.

An image sensor according to embodiments will be described with reference to example FIG. 9. According to embodiments, an image sensor may include an interlayer dielectric film 20, metal wires 30 and 40, photo diode patterns 55, device isolation dielectric layer 70, first metal film pattern 81, and second metal film pattern 82.

Interlayer dielectric film 20 may include metal wires 30 and 40 on and/or over semiconductor substrate 10, including pixel part A and peripheral part B. Interlayer dielectric film 20 in peripheral part B may further include pad PAD. According to embodiments, photo diode patterns 55 may be reciprocally isolated by device isolation trench 65 on and/or over interlayer dielectric film 20, and may be connected to metal wire 30 in pixel part A.

Device isolation dielectric layer 70 may be formed on and/or over device isolation trench 65 and a top of photo diode pattern 55 in pixel part A and on and/or over a top of interlayer dielectric film 20 in peripheral part B. According to embodiments, device isolation dielectric layer 70 may be formed on and/or over via holes 71 and 72, which may partially expose photo diode pattern 55 and metal wire 40 in peripheral part B, respectively.

First metal film pattern 81 may be gap-filled in via hole 71 in pixel part A, and may be connected to photo diode pattern 55. Second metal film pattern 82 may be gap-filled in the via hole 72 in peripheral part B, and may be connected to metal wire 40.

According to embodiments, an image sensor and a method for manufacturing the same may reduce a step by using polymer 95 formed through a spin coating process, although a step may occur in pixel part A and peripheral part B. According to embodiments, a step in pixel part A and peripheral part B may be reduced using polymer 95. According to embodiments, photo and etching processes may be performed. This may prevent a change in a position of a top metal wire when it is patterned to form top metal wires 81 and 82, which may increase margins. This may improve a quality of a device.

According to embodiments, photo diode 55 may be formed on and/or over the semiconductor substrate including metal wires 30 and 40. This may make it possible to form a vertical integration of an image sensor. According to embodiments, a vertical integration of a transistor circuitry and a photo diode may be achieved.

According to embodiments, a photo diode may be formed inside a crystalline semiconductor substrate. This may reduce defects of a photo diode, while adopting a vertical photo diode structure. According to embodiments, a photo diode may be isolated for each unit pixel by a device isolation dielectric layer. This may reduce crosstalk and noise.

According to embodiments, an image sensor may be vertically integrated. Vertical integration of transistor circuitry and a photo diode may allow a fill factor to approach 100%, and may achieve higher sensitivity without modifying a pixel size.

According to embodiments, an image sensor may provide higher sensitivity while maintaining a same pixel size as that of a related art sensor by implementing vertical integration. According to embodiments, processing costs may also be reduced. According to embodiments, respective unit pixels may implement a more complete circuitry without a reduction in sensitivity, and additional on-chip circuitry that may be integrated may improve a performance of an image sensor. This may make it possible to further obtain miniaturization of a device and a reduction in manufacturing costs.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method, comprising:
forming a semiconductor substrate including a pixel part and a peripheral part;
forming an interlayer dielectric film including a metal wire in the pixel part and a metal wire in the peripheral part over the semiconductor substrate;
forming a photo diode pattern over the interlayer dielectric film and connected to the metal wire in the pixel part;
forming a device isolation dielectric layer over the photo diode pattern in the pixel part and over the interlayer dielectric film in the peripheral part, the device isolation dielectric layer having via holes to at least partially expose the photo diode pattern and the metal wire in the peripheral part;
forming a metal film over the device isolation dielectric layer including the via holes;
forming a planarization layer over the metal film to planarize the pixel part and the peripheral part; and
forming simultaneously a first metal film pattern connected to the photo diode pattern and a second metal film pattern connected to the metal wire in peripheral part by patterning the planarization layer and metal film.

2. The method of claim 1, comprising:
forming a plurality of metal wires over the semiconductor substrate in the pixel part; and
forming a plurality of photo diode patterns over the interlayer dielectric film connected to respective ones of the plurality of metal wires in the pixel part, wherein
each of the plurality of photo diode patterns is isolated by a device isolation trench between respective photo diode patterns, and wherein the device isolation dielectric layer is formed in the device isolation trench.

3. The method of claim 2, wherein each of the plurality of photo diode patterns is at least partially exposed by corresponding via holes.

4. The method of claim 2, wherein forming the plurality of photo diode patterns comprises:
forming a photo diode by performing an ion implantation over a crystalline semiconductor substrate;
bonding the crystalline semiconductor substrate onto the semiconductor substrate;
forming hard masks over the photo diode corresponding to locations of each of the plurality of metal wires in the pixel part; and
forming the device isolation trench to selectively expose the interlayer dielectric film, by etching the photo diode using the hard masks as an etching mask.

5. The method of claim 4, wherein forming the photo diode patterns comprises removing the crystalline semiconductor substrate so that only the photo diode remains after performing the bonding.

6. The method of claim 2, wherein forming the device isolation dielectric layer comprises:
forming the device isolation dielectric layer over the photo diode pattern in pixel part and over the interlayer dielectric film in the peripheral part, including filling the device isolation trench;
forming a photoresist pattern over a top of the device isolation dielectric layer;
selectively removing the device isolation dielectric layer using the photoresist pattern as a mask to form the via holes; and
removing the photoresist pattern by ashing.

7. The method of claim 1, wherein the photo diode pattern has a first height that is greater than a height of a surface of the interlayer dielectric film in the peripheral part.

8. The method of claim 7, wherein the device isolation dielectric layer has a step corresponding to heights of the photo diode pattern in the pixel part and the interlayer dielectric film in the peripheral part.

9. The method of claim 7, wherein the planarization layer is formed to have a thickness that is approximately 90 to 110% of the first height.

10. The method of claim 1, wherein forming the planarization layer comprises:
forming a first polymer over the metal film; and
forming a second polymer over the first polymer.

11. The method of claim 10, wherein the first polymer comprises spin on hard mask (SOH) material including a silicon (Si) group, and the second polymer comprises SOH material including a carbon (C) group.

12. The method of claim 10, wherein the first and second polymers are formed through a spin coating process.

13. The method of claim 10, wherein a ratio of a thickness of the first polymer to a thickness of the second polymer ranges from approximately 3:5 to 4:6.

14. The method of claim 13, wherein the ratio of the thickness of the first polymer to the thickness of the second polymer is approximately 4:5.

15. The method of claim 13, wherein the first polymer is formed to have a thickness of approximately 0.8 μm.

16. The method of claim 10, wherein forming the first and second metal film patterns comprises:
forming a photoresist pattern over a top of the planarization layer;
etching the second polymer using the photoresist pattern as a mask;
etching the first polymer; and
etching the metal film.

17. The method of claim 1, wherein the photo diode pattern comprises a crystalline structure.

* * * * *